United States Patent [19]
Floyd

[11] Patent Number: 6,144,683
[45] Date of Patent: *Nov. 7, 2000

[54] RED, INFRARED, AND BLUE STACKED LASER DIODE ARRAY BY WAFER FUSION

[75] Inventor: Philip D. Floyd, Sunnyvale, Calif.

[73] Assignee: Xerox Corporation, Stamford, Conn.

[ * ] Notice: This patent is subject to a terminal disclaimer.

[21] Appl. No.: 09/004,176

[22] Filed: Jan. 7, 1998

[51] Int. Cl.$^7$ .................................................. H01S 3/19
[52] U.S. Cl. .................. 372/50; 372/43; 372/68; 372/97
[58] Field of Search ..................... 372/43, 50, 68, 372/97

[56] References Cited

PUBLICATIONS

R. K. Sink et al., "Cleaved GaN facets by wafer fusion of GaN to InP", *Applied Physics Letters*, vol. 68, No. 15, Apr. 8, 1996, pp. 2147–2149.

R. J. Ram et al., "GaAs to InP wafer fusion", *Journal of Applied Physics*, vol. 78, No. 6, Sep. 15, 1995, pp. 4227–4237.

Y. H. Lo, "Semiconductor lasers on Si substrates using the technology of bonding by atomic rearrangement", *Applied Physics Letters*, vol. 62, No. 10, Mar. 8, 1993, pp. 1038–1040.

*Primary Examiner*—Hemang Sanghavi
*Assistant Examiner*—Benjamin Cushwa
*Attorney, Agent, or Firm*—William Propp

[57] ABSTRACT

An infrared laser structure is stacked on top of a red laser structure with both having an inverted or p-side down orientation. The red/infrared stack laser structure is inverted and wafer fused to a blue laser structure to form a red/infrared/blue monolithic laser structure. The top semiconductor layer of the inverted red/infrared stack laser structure is a GaInP fusion bonding layer which will be wafer fused to the top semiconductor layer of the blue laser structure which is a GaN cladding/contact layer.

6 Claims, 4 Drawing Sheets

RED, INFRARED, AND BLUE STACKED LASER DIODE ARRAY BY WAFER FUSION

BACKGROUND OF THE INVENTION

This invention relates to a monolithic red, infrared and blue wavelength laser structure and, more particularly, to a red/IR stacked dual laser structure which is wafer fused to a blue laser structure.

Addressable monolithic multi-wavelength light sources, especially arrays that can simultaneously emit different wavelength light beams from different laser elements in the monolithic structure are useful in a variety of applications, such as color printing, full color digital film recording, color displays, and other optical recording and storage system applications.

The performance of many devices, such as laser printers and optical memories, can be improved by the incorporation of multiple laser beams. For example, laser printers which use multiple beams can have higher printing speeds and/or better spot acuity than printers which use only a single beam. Recent advances in xerography, such as described in commonly assigned Kovacs et al. U.S. Pat. No. 5,347,303 on "Full Color Xerographic Printing System with Dual Wavelength, Single Optical System ROS and Dual Layer Photoreceptor" (which is hereby incorporated by reference), have created quad-level xerography (sometimes referred to as "xerocolography") that enables the printing of three colors (for example, black plus two highlight colors) in a single pass by a single xerographic station.

In these and many applications, closely spaced laser beams of different wavelengths are desirable.

One way to obtain closely spaced laser beams is to form multiple laser emission sites, or laser stripes, on a common substrate. While this enables very closely spaced beams, prior art monolithic laser arrays typically output laser beams at only one wavelength.

Various techniques are known in the prior art for producing different wavelength laser beams from a monolithic laser array. For example, it is well known that a small amount of wavelength difference can be obtained by varying the drive conditions at each lasing region. However, the easily achievable but small wavelength difference is insufficient for most applications.

Ideally, for most desired applications, the laser elements should emit light of different widely spaced wavelengths. In a preferred monolithic structure, the laser elements would emit light across a widely spaced spectrum from infrared to red to blue wavelengths. One problem is that laser sources of different wavelengths require different light emission active layers; i.e. nitride semiconductor layers such as InGaN for blue lasers, arsenide semiconductor layers such as AlInGaAs for infrared and phosphide semiconductor layers such as GaInP for red lasers.

One method of achieving these larger wavelength separations is to grow a first set of active layers on a substrate to form a first lasing element which outputs light at one wavelength, and then to etch and regrow a second set of active layers next to the first to form a second lasing element at a second wavelength. However, this method requires separate crystal growths for each lasing element, something which is not easily performed. Furthermore, the arsenide and phosphide semiconductor structures of infrared and red lasers use a different, non-compatible substrate with the nitride semiconductor structures of blue lasers. Lattice mismatching between semiconductor layers will result in poor or non-existent performance of one or more of the laser structures.

Another technique for obtaining different wavelength laser beams from a monolithic laser array is to use stacked active regions. A stacked active region monolithic array is one in which a plurality of active regions are sandwiched between common cladding layers. Each active region is comprised of a thin volume that is contained within a laser stripe. The laser stripes contain different numbers of active regions that emit laser beams at different wavelengths.

In a stacked active region monolithic laser array, current flows in series through the stacked active regions. The active region with the lowest bandgap energy will lase, thereby determining the wavelength of the laser beam output from that part of the array. To provide another wavelength output, the previously lowest bandgap energy active region is removed from part of the array and current is sent through the remaining stacked regions.

A major problem with stacked active region monolithic laser arrays is that they have been difficult to fabricate, even with just arsenide and phosphide semiconductor layers. The addition of nitride semiconductor layers makes optical performance nearly impossible and impractical in any real world applications.

It is an object of this invention to provide stacked active region lasers in a monolithic structure capable of outputting closely spaced, multiple wavelength laser beams in the infrared to red to blue wavelength spectrum.

SUMMARY OF THE INVENTION

The present invention provides an infrared laser structure stacked on top of a red laser structure with both having an inverted or p-side down orientation. The red/infrared stack laser structure is inverted and wafer fused to a blue laser structure to form a red/infrared/blue monolithic laser structure. The top semiconductor layer of the inverted red/infrared stack laser structure is a GaInP fusion bonding layer which will be wafer fused to the top semiconductor layer of the blue laser structure which is a GaN cladding/contact layer.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

The present invention involves fabricating a Red/IR stack laser structure with an inverted or p-side down orientation, fabricating a Blue laser structure with standard or p-side up orientation, flipping over the inverted Red/IR stack laser structure to wafer fuse the Red/IR stack laser structure to the Blue laser structure and forming the resulting Red/IR/Blue stack laser monolithically integrated structure with standard or p-side up orientation for each laser.

Figure 1:
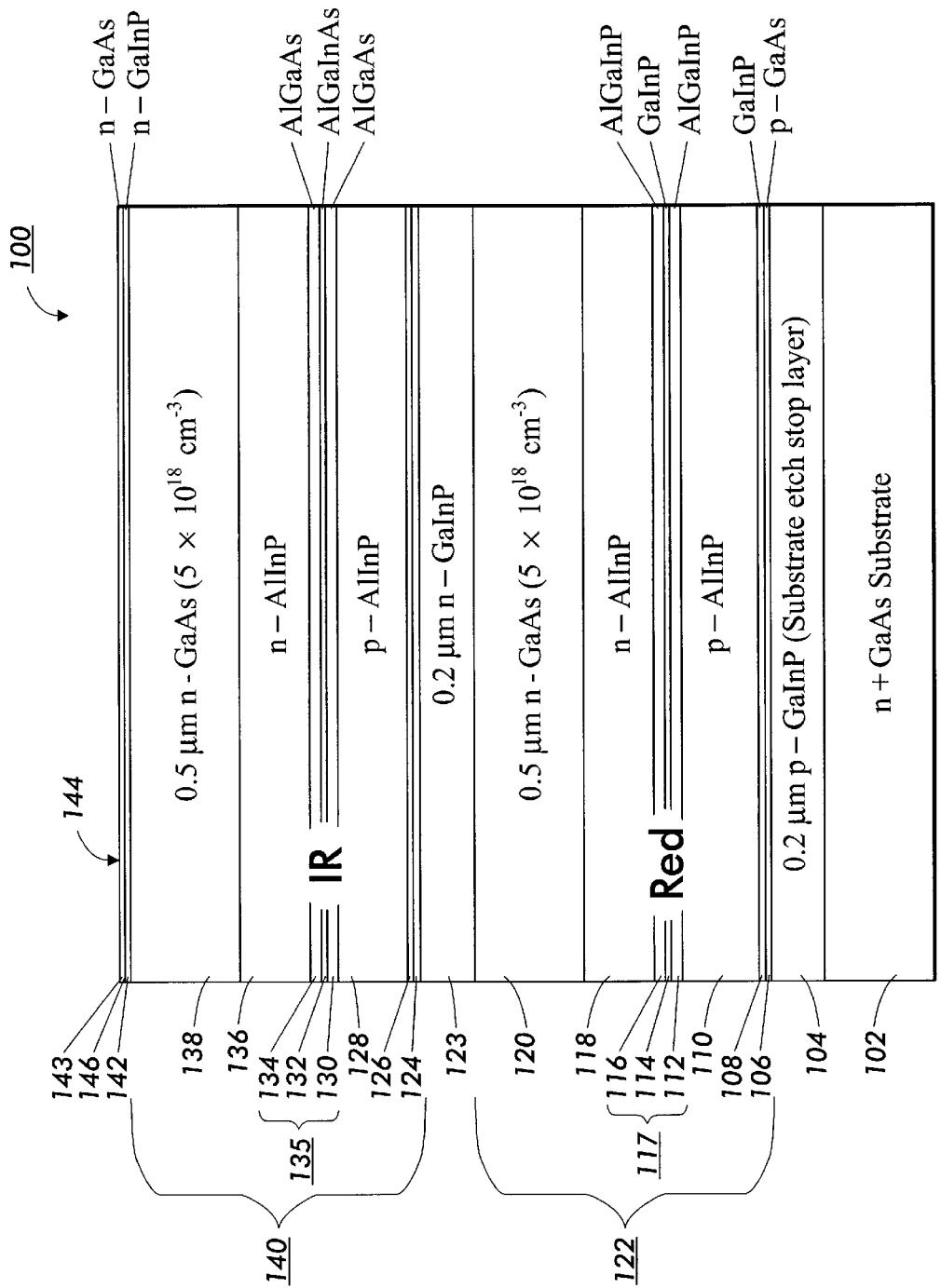
FIG. 1 is a cross-sectional side view of the semiconductor layers of the Red/IR stack inverted laser structure of the present invention.

Reference is now made to FIG. 1 which illustrates a Red/IR stack inverted laser structure 100 in accordance to the present invention. The laser structure 100 is grown in an inverted or p-side down orientation.

As shown in FIG. 1, a substrate removal etch stop layer 104 of p-$Ga_{0.5}In_{0.5}P$ of 0.2 $\mu$m thickness is grown on a GaAs substrate 102 using a well-known epitaxial deposition process commonly referred to as metal-organic chemical vapor deposition (MOCVD). Other deposition processes such as liquid phase epitaxy (LPE), molecular beam epitaxy (MBE), or other known crystal growth processes can also be used. The p-GaInP etch stop layer 104 has a magnesium doping of $1\times10^{18}$ cm$^{-3}$. The GaAs substrate 102 can be p-type or n-type or semi-insulating.

Upon the substrate removal etch stop layer 104 is deposited a p+-GaAs cap layer 106, which typically is 100 nanometers thick with a magnesium doping of $1\times10^{19}$ cm$^{-3}$. Upon the p+-GaAs cap layer 106 is a barrier reduction p-type $Ga_{0.5}In_{0.5}P$ layer 108, which typically has a thickness of 50 nanometers, and a magnesium doping level of approximately $5\times10^{18}$ cm$^{-3}$.

Upon the GaInP barrier reduction layer 108 is deposited a p-type $Al_{0.5}In_{0.5}P$ lower cladding layer 110. Typically, this p-cladding layer 110 has a magnesium doping level of $1\times10^{18}$ cm$^{-3}$. The thickness of the AlInP cladding layer 110 is approximately one micron ($\mu$m).

Above the lower p-cladding layer 110 is deposited an undoped $In_{0.5}(Al_{0.6}Ga_{0.4})_{0.5}P$ lower confinement layer 112, which has a thickness of about 120 nanometers. After this lower confinement layer 112 has been deposited, an $G_{0.4}In_{0.6}P$ active layer 114 is deposited, which will result in a light emission at 670 to 680 nanometers. The active layer 114 may be a single quantum well, a multiple quantum well, or a layer with thickness greater than that of a quantum well. The thickness of a quantum well typically ranges from five to twenty nanometers and in this example is 8 nanometers. Above the active layer 114 is deposited an undoped $In_{0.5}(Al_{0.6}Ga_{0.4})_{0.5}P$ upper confinement layer 116. The confinement layer 116 has a thickness of about 120 nanometers. The lower and upper confinement layers, 112 and 116, together with the active layer 114, form the active region 117 of the laser structure.

After the upper confinement layer 116 has been formed, a n-type $Al_{0.5}In_{0.5}P$ upper cladding layer 118 of about one micron is deposited. The doping level of the upper cladding layer 118 range from 1 to $5\times10^{18}$ cm$^{-3}$.

Upon the upper cladding layer 118 is deposited a n-type GaAs contact layer 120. The thickness of the GaAs layer 120 is approximately one-half micron (0.5 $\mu$m). The doping level of the n-type GaAs layer 120 is approximately $5\times10^{18}$ cm$^{-3}$.

These semiconductor layers 106 to 120 form the red laser structure 122.

Upon the n-GaAs layer 120 of the red laser structure 122 is deposited an etch stop layer 123 of p-$Ga_{0.5}In_{0.5}P$ of 0.2 $\mu$m thickness and a magnesium doping of $1\times10^{18}$ cm$^{-3}$. Upon the etch stop GaInP layer 123 is deposited a p+-GaAs cap layer 124, which typically is 100 nanometers thick with a magnesium doping of $1\times10^{19}$ cm$^{-3}$. Upon the p+-GaAs cap layer 124 is deposited a barrier reduction p-type $Ga_{0.5}In_{0.5}P$ layer 126, which typically has a thickness of 50 nanometers and a magnesium doping level of approximately $5\times10^{18}$ cm$^{-3}$.

Upon the GaInP barrier reduction layer 126 is deposited a p-type $Al_{0.5}In_{0.5}P$ lower cladding layer 128. Typically, this p-cladding layer 128 has an aluminum content of 50% and a magnesium doping level of $1\times10^{18}$ cm$^{-3}$. The thickness of the AlInP cladding layer 128 is approximately one micron ($\mu$m).

Above the lower p-cladding layer 128 is deposited an undoped $Al_{0.4}Ga_{0.6}As$ lower confinement layer 130, which has a thickness of about 120 nanometers. After this lower confinement layer 130 has been deposited, an $Al_{0.15}Ga_{0.7}In_{0.15}As$ active layer 132 is deposited, which should result in a light emission at approximately 820 nanometers. The active layer 132 may be a single quantum well, a multiple quantum well, or a layer with thickness greater than that of a quantum well. The thickness of a quantum well typically ranges from five to twenty nanometers and in this example is 7 nanometers. Above the active layer 132 is deposited an undoped $Al_{0.4}Ga_{0.6}As$ upper confinement layer 134. The confinement layer 134 has a thickness of about 120 nanometers. The lower and upper confinement layers, 130 and 134, together with the active layer 132, form the active region 135 of the laser structure.

After the upper confinement layer 134 has been formed, a n-type $Al_{0.5}In_{0.5}P$ upper cladding layer 136 of about one micron is deposited. The doping level of the upper cladding layer is $1\times10^{18}$ cm$^{-3}$.

Upon the upper cladding layer 136 is deposited a n-type GaAs contact layer 138. The thickness of the GaAs layer 138 is approximately one-half micron (0.5 $\mu$m). The doping level of the n-type GaAs layer 138 is approximately $5\times10^{18}$ cm$^{-3}$.

These semiconductor layers 124 to 138 form the infrared laser structure 140.

Upon the n-GaAs layer 138 of the infrared laser structure 140 is deposited a n-type $Ga_{0.5}In_{0.5}P$ fusion bonding layer 142, which typically has a thickness of 50 nanometers and a silicon doping level of approximately $5\times10^{18}$ cm$^{-3}$. Upon the n-GaInP fusion bonding layer 142 is deposited a n+-GaAs protective cap layer 143, which typically is 100 nanometers thick with a silicon doping of $1\times10^{19}$ cm$^{-3}$.

Figure 2:
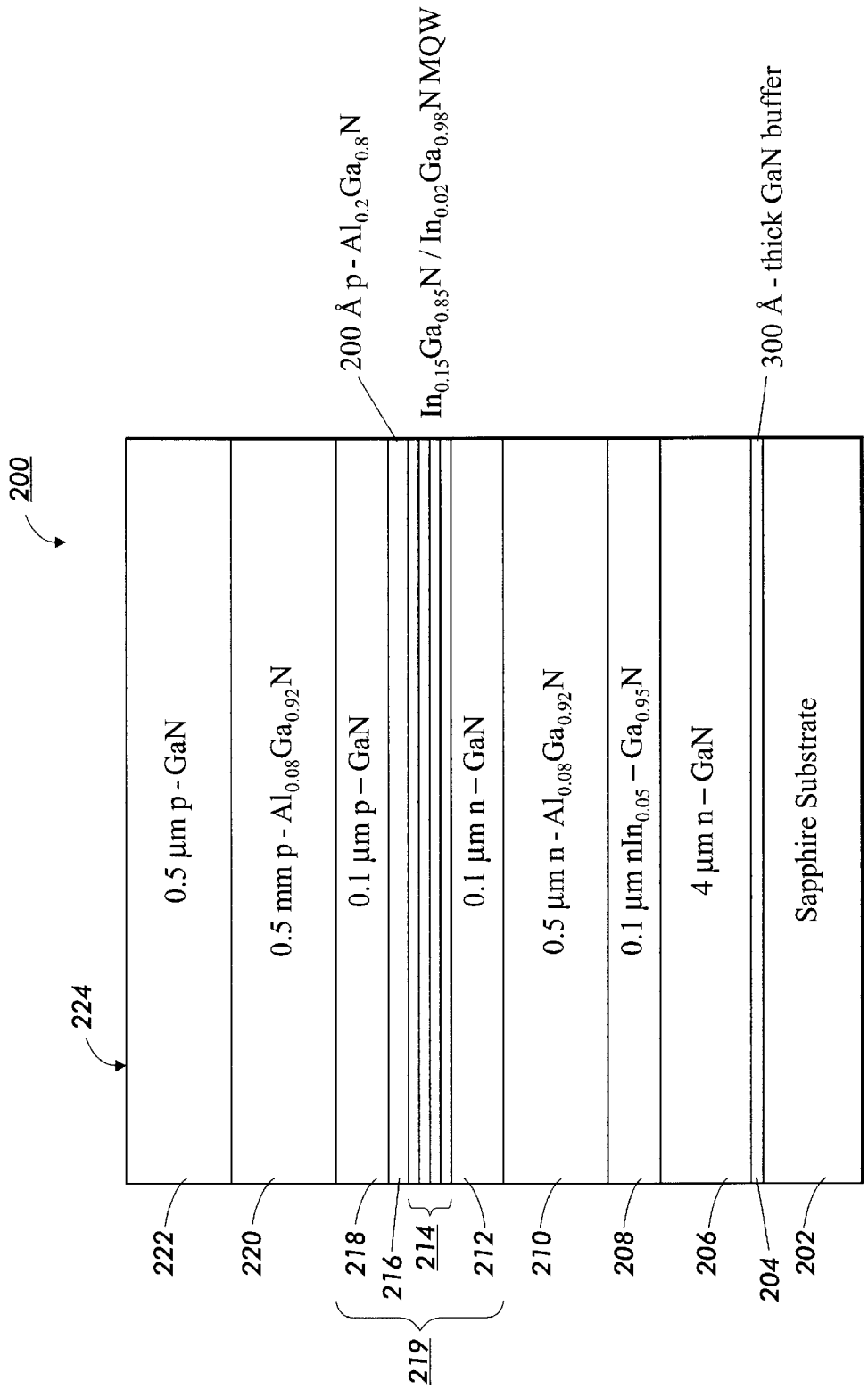
FIG. 2 is a cross-sectional side view of the semiconductor layers of the Blue laser structure of the present invention.

Reference is now made to FIG. 2 which illustrates a Blue laser structure 200 in accordance to the present invention. The laser structure 200 is grown in a standard or p-side up orientation.

The Blue laser structure 200 has a sapphire ($Al_2O_3$) substrate 202. Upon the substrate 200 is deposited an undoped GaN buffer layer 204 which has a thickness of 30 nanometers. A n-GaN cladding layer 206 is deposited on the undoped buffer layer 204. The cladding layer is silicon doped at $1\times10^{18}$ cm$^{-3}$ and has a thickness of 4 microns. A n-$In_{0.05}Ga_{0.95}N$ stress reduction layer 208 is deposited on the n-GaAs cladding layer 206. The InGaN stress reduction layer 208 has a thickness of 0.1 microns and a silicon doping level of $1\times10^{18}$ cm$^{-3}$. Upon the InGaN stress reduction layer 208 is deposited a n-$Al_{0.08}Ga_{0.92}N$ lower confinement layer 210. The n-confinement layer 210 is silicon doped at $1\times10^{18}$ cm$^{-3}$ and has a thickness of 0.5 microns.

An n-GaN waveguiding layer 212 is deposited on the n-AlGaN lower confinement later 208. The GaN waveguiding layer 212 is 0.1 microns thick and is silicon doped at $1\times10^{18}$ cm$^{-3}$. An $In_{0.15}Ga_{0.85}N/In_{0.02}Ga_{0.98}N$ multiple quantum well active layer 214 is deposited on the waveguiding layer 212. The $In_{0.15}Ga_{0.85}N/In_{0.02}Ga_{0.98}N$ multiple quantum well active layer 214 has 3 to 20 quantum wells and is about 50 nanometers thick and emits light at 410 to 430 nanometers. A p-$Al_{0.2}Ga_{0.8}N$ carrier confinement layer 216 is deposited on the active layer 214. The p-AlGaN carrier confinement layer 216 is magnesium doped at $5\times10^{19}$ cm$^{-3}$ and has a thickness of 0.02 microns. An p-GaN waveguiding layer 218 is deposited on the p-AlGaN carrier confinement later 216. The GaN waveguiding layer 218 is 0.1 microns thick and is magnesium doped at $5 \times 10^{19}$ cm$^{-3}$. The waveguiding layers 212 and 218, together with the confinement layer 216 and the active layer 214 form the active region 219 of the laser structure.

A p-Al$_{0.08}$Ga$_{0.92}$N upper confinement layer 220 is deposited on the waveguiding layer 218. The p-confinement layer 220 is magnesium doped to $5 \times 10^{19}$ cm$^{-3}$ and has a thickness of 0.5 microns. A p-GaN cladding/contact layer 222 is deposited on the p-confinement layer 220. The cladding/contact layer 222 is magnesium doped to $5 \times 10^{19}$ cm$^{-3}$ and has a thickness of 0.5 microns.

Figure 3:
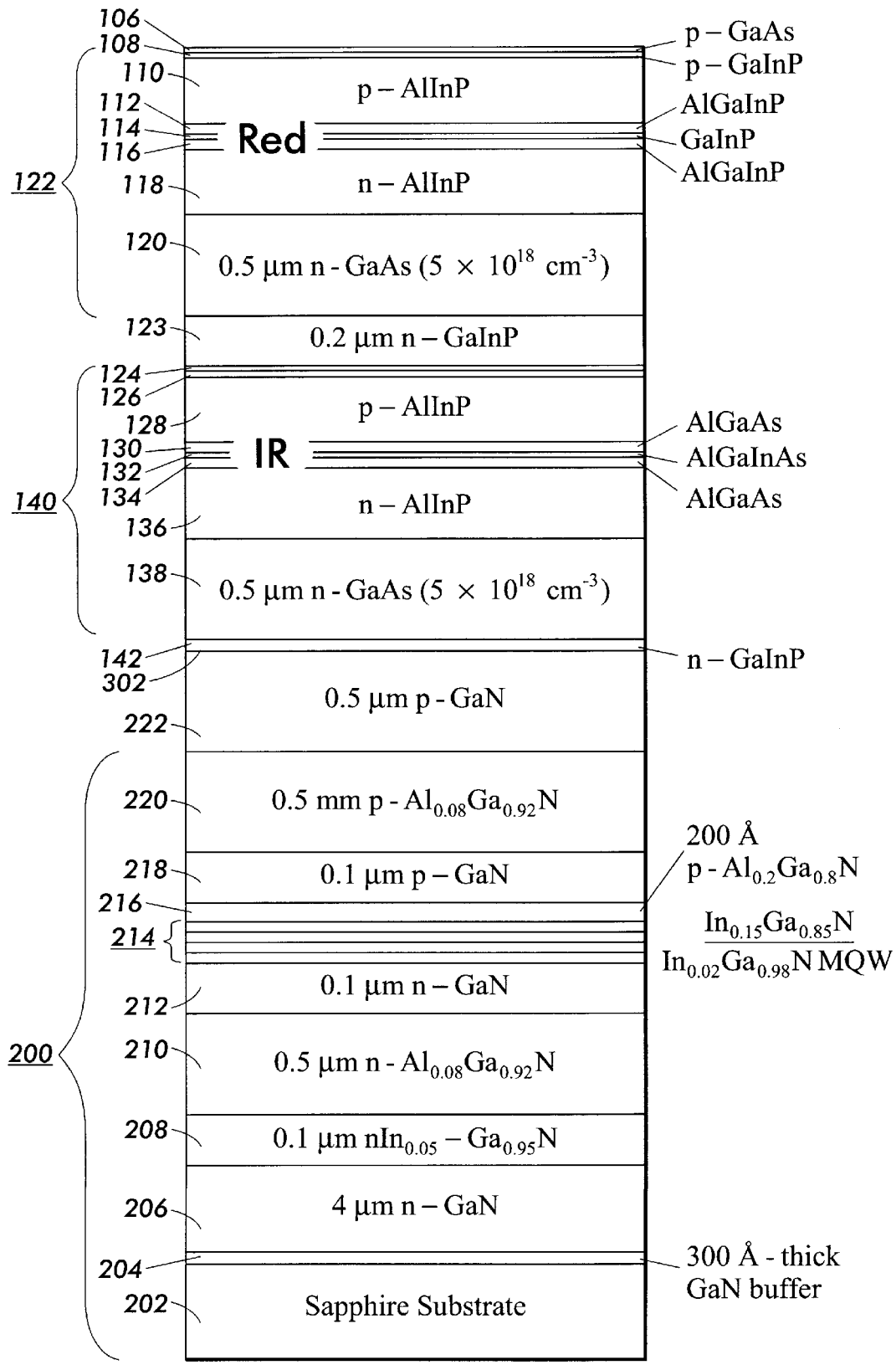
FIG. 3 is a cross-sectional side view of the semiconductor layers of the Red/IR/Blue stack laser structure formed by wafer fusion of the present invention.

The exposed upper surface 144 of the cap layer 143 of the Red/IR stack laser structure 100 of FIG. 1 and the exposed upper surface 224 of the cladding/contact layer 222 of the Blue laser structure 200 of FIG. 2 are cleaned with solvents. The exposed surface 224 of the Blue laser structure 200 is immersed in hydroflouric acid (HF). The exposed surface 144 of the layer 143 is immersed in a solution of sulfuric acid:hydrogen peroxide:water (H$_2$SO$_4$:H$_2$O$_2$:H$_2$O). This solution selectively etches the GaAs protective capping layer 143, exposing the surface 146 of the fusion bonding layer 142. The fusion bonding layer is etched for 1 minute in hydrobromic acid (HBr). The surface 146 is rinsed in deionized water. The surface 224 of the Blue laser structure 200 is removed from the HF and rinsed in deionized water. Both the Blue laser structure surface 224 and the Red/IR laser structure surface 146 are blown dry with nitrogen gas. The exposed surface 146 of the fusion bonding layer 142 of the Red/IR laser structure 100 is pressed together with the exposed surface 224 of the contact/cladding layer 222 of the Blue laser structure 200, as shown in FIG. 3. The joined stack laser structure 300 of FIG. 3 is then placed into a quartz/graphite fixture (not shown) which applies uniform, uniaxial pressure on the laser structure 300. The fixture is placed into a furnace and heated to a temperature of 750° C. for sixty minutes in a hydrogen gas ambient. Pressure is applied to the laser structure 300 by utilizing the differential expansion coefficients of the quartz and graphite materials in the fixture. The fixture applies pressure in the range of 1 to 8 MPa. The fusion bonding layer 142 of the Red/IR stack laser structure 100 is thus fused along an interface 302 to the cladding/contact layer 222 of the Blue laser structure forming a Red/IR/Blue stack laser structure 300.

The sacrifical GaAs substrate 102, which has provided structural support during the deposition of the red laser structure and during the subsequent wafer fusion of the red laser structure to the blue laser structure, is removed by chemical/mechanical polishing with bleach to a thickness of 50 to 100 microns. The remainder of the GaAs substrate 102 is completely etched away by a sulfuric acid:hydrogen peroxide (H$_2$SO$_4$:H$_2$O$_2$) solution to the substrate removal etch stop layer 104. The substrate removal etch stop layer 104 is removed by etching with hydrobromic acid (HBr) to the cap layer 106. The p+-GaAs cap layer 106 of the red laser structure is now the uppermost semiconductor layer in the Red/Blue stack laser structure 300.

Wafer fusion creates a non-lattice matched heterostructure, the monolithically integrated laser structure 300 in this embodiment. This monolithic integration of the Red/IR/Blue stack laser structure 300 provides a closely spaced, precisely spaced structure of three different, widely spaced wavelength laser sources, necessary for precision optical systems.

The Red/IR stack laser structure 100 will be inverted to standard p-side up orientation then fused to the blue laser structure 200 which was already in the standard p-side up orientation. The resulting Red/IR/Blue stack laser structure 300 has a standard p-side up orientation.

As shown in FIG. 3, the resulting Red/IR/Blue stack laser structure 300 after wafer fusion has semiconductor layers, in sequence, of a sapphire (Al$_2$O$_3$) substrate 202, an undoped GaN buffer layer 204, a n-GaN cladding layer 206, a n-In$_{0.05}$Ga$_{0.95}$N stress reduction layer 208, a n-Al$_{0.08}$Ga$_{0.92}$N lower confinement layer 210, an n-GaN waveguiding layer 212, an In$_{0.15}$Ga$_{0.85}$N/In$_{0.02}$Ga$_{0.98}$N multiple quantum well active layer 214, a p-Al$_{0.2}$Ga$_{0.8}$N carrier confinement layer 216, a p-GaN waveguiding layer 218, a p-Al$_{0.08}$Ga$_{0.92}$N upper confinement layer 220, a p-GaN cladding/contact layer 222, a fusion bonding layer 142 of GaInP, a n-type GaAs contact layer 138, a n-type Al$_{0.5}$In$_{0.5}$P upper cladding layer 136, an undoped Al$_{0.4}$Ga$_{0.6}$As confinement layer 134, an GaAs active layer 132, an undoped Al$_{0.4}$Ga$_{0.6}$As confinement layer 130, a p-type Al$_{0.5}$In$_{0.5}$P cladding layer 128, a barrier reduction p-Ga$_{0.5}$In$_{0.5}$P layer 126, a p+-GaAs cap layer 124, an etch stop layer 123 of p-Ga$_{0.5}$In$_{0.5}$P, a n-type GaAs contact layer 120, a n-type Al$_{0.5}$In$_{0.5}$P cladding layer 118, an undoped In$_{0.5}$(Al$_{0.6}$Ga$_{0.4}$)$_{0.5}$P confinement layer 116, an Ga$_{0.4}$In$_{0.6}$P active layer 114, an undoped In$_{0.5}$(Al$_{0.6}$Ga$_{0.4}$)$_{0.5}$P confinement layer 112, a p-type Al$_{0.5}$In$_{0.5}$P cladding layer 110, a barrier reduction p-Ga$_{0.5}$In$_{0.5}$P layer 108, and a p+-GaAs cap layer 106.

The semiconductor layers 202 to 222 form the blue laser structure 200. The semiconductor layers 124 to 138 form the infrared laser structure 140. The semiconductor layers 106 to 120 form the red laser structure 122. From the bottom up, the Red/IR/Blue stack laser structure 300 has a blue laser structure 200, an infrared laser structure 140 and a red laser structure 122. The infrared laser structure 140 and the red laser structure 122 now have standard p-side up orientation.

Figure 4:
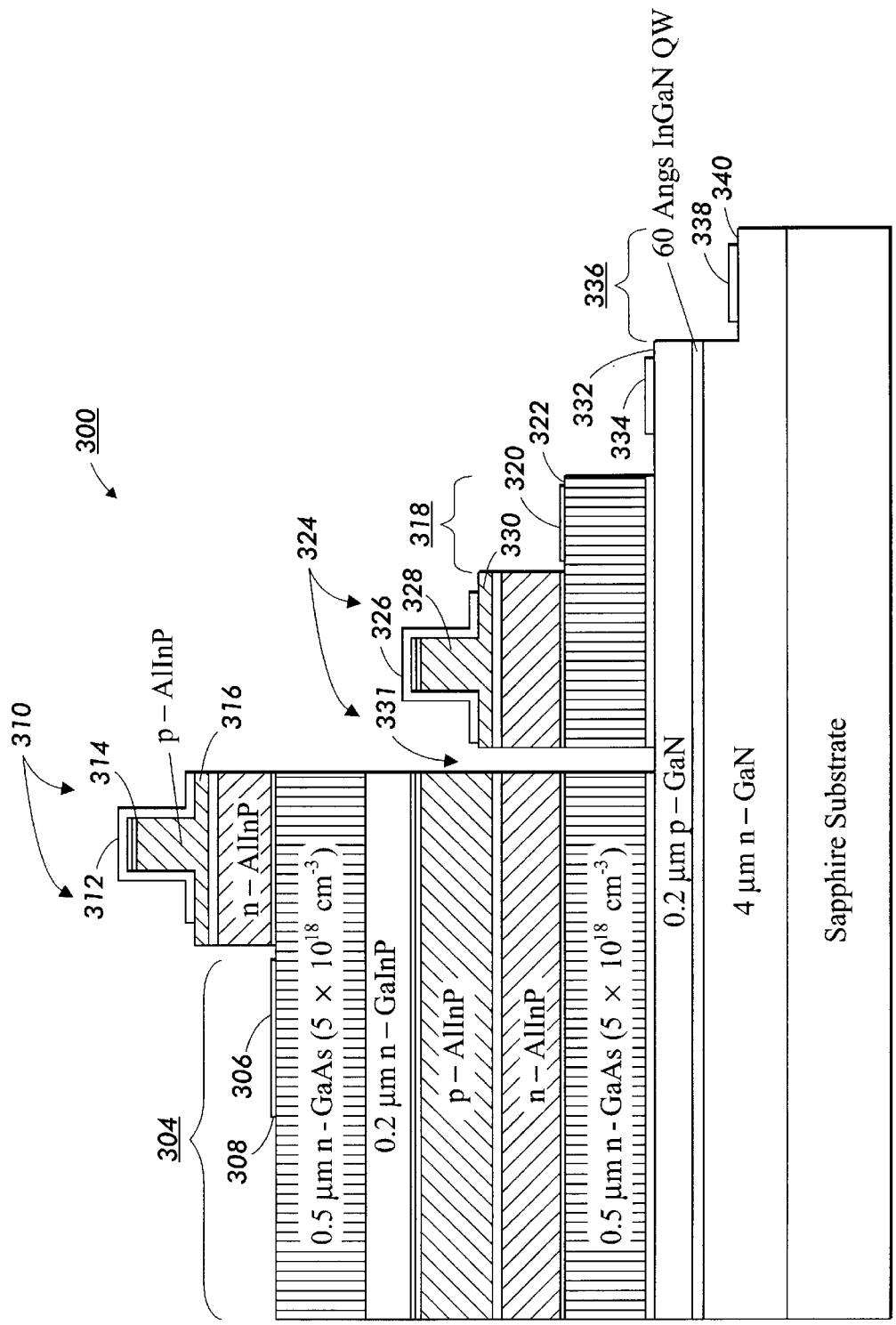
FIG. 4 is a cross-sectional side view of the Red/IR/Blue stack laser structure with independently addressable contacts for each laser structure and with metal clad ridge waveguides of the present invention.

As shown in FIG. 4, independently addressable red, infrared and blue lasers can be fabricated in a monolithic laser array structure by conventional masking and etching and conventional deposition of metal contacts. For ease of understanding, the masking steps are not shown and the etching and contact deposition are not shown in order.

In the red laser structure 122 in FIG. 4, a portion 304 is etched down through the cap layer 106, the barrier reduction layer 108, the p-cladding layer 110, the confinement layer 112, the active layer 114, the confinement layer 116, and the n-cladding layer 118 to the n-contact layer 120. An Au:Ge n-contact 306 is formed on the surface 308 of the n-contact layer 120 for the red laser structure 122.

In the red laser structure 122 in FIG. 4, portions 310 are etched through the cap layer 106, the barrier reduction layer 108, and the p-cladding layer 110 to the confinement layer 112 forming a mesa structure. A Ti-Au p-contact 312 is formed on the surface 314 of the confinement layer 118 and the unetched cap layer 106, the barrier reduction layer 108 and the p-cladding layer 110 for the red laser structure 122. The remaining unetched p-cladding layer 110 forms a metal clad ridge waveguide 316 for the red laser structure 122.

In the infrared laser structure 140 in FIG. 4, the semiconductor layers of the red laser structure 122 and the etch stop layer 123 are etched away. A portion 318 of the infrared laser structure 140 is etched down through the cap layer 124, the barrier reduction layer 126, the p-cladding layer 128, the confinement layer 130, the active layer 132, the confinement layer 134, and the n-cladding layer 136 to the n-contact layer 138. An Au:Ge n-contact 320 is formed on the surface 322 of the n-contact layer 138 for the infrared laser structure 140.

In the infrared laser structure 140 in FIG. 4, portions 324 are etched through the cap layer 124, the barrier reduction layer 126, and the p-cladding layer 128 to the confinement layer 130 forming a mesa structure. A Ti-Au p-contact 326 is formed on the surface 328 of the confinement layer 130 and the unetched cap layer 124, the barrier reduction layer 126 and the p-cladding layer 128 for the infrared laser structure 140. The remaining unetched p-cladding layer 128 forms a metal clad ridge waveguide 330 for the red laser structure 140.

An isolation groove 331 is etched between the infrared laser structure 140 and the red laser structure 122 down to the p-GaN cladding/contact layer 222 of the blue laser structure 200 to provide electrical and thermal isolation between the infrared and red laser structures in order to reduce crosstalk between the two laser structures.

In the blue laser structure 200 in FIG. 4, the semiconductor layers of the red laser structure 122, the etch stop layer 123, the infrared laser structure 140 and fusion bonding layer 142 are etched away to the surface 332 of the p-GaN cladding/contact layer 222. A Ti-Au p-contact 334 is formed on the surface 332 of the p-GaN cladding/contact layer 222 for the blue laser structure 200.

In the blue laser structure 200 of FIG. 4, a portion 336 is etched down through the cladding/contact layer 222, the p-confinement layer 220, the waveguiding layer 218, the p-carrier confinement layer 216, the active layer 214, the waveguiding layer 212, the confinement layer 210, the stress reduction layer 208 and into the n-cladding layer 206. An Ti:Au n-contact 338 is formed on the surface 340 of the n-cladding layer 206 for the blue laser structure 200.

The Red/IR/Blue stack laser structure 300 is an edge emitting array. Conventional facets (not shown) are provided on the edge of the laser structure 300. The facets can be formed by dry etching the Red/IR laser structure 100 and the Blue laser structure 200. Alternately, if the Blue laser structure has an a-face sapphire substrate 202, then the Red/IR laser structure 100 and the Blue laser structure 200 can be cleaved simultaneously in the Red/IR/Blue stack laser structure 300.

The red laser structure 122 will emit light of red wavelength from the active region 117 including the active layer 114 through the edge of the laser structure. The red laser structure 122 is independently addressable through contacts 306 and 312 separate from the infrared laser structure 140 and the blue laser structure 200.

Similarly, the infrared laser structure 140 will emit light of infrared wavelength from the active region 135 including the active layer 132 through the edge of the laser structure. The infrared laser structure 140 is independently addressable through contacts 320 and 326 separate from the red laser structure 122 and the blue laser structure 200. And the blue laser structure 200 will emit light of blue wavelength from the active region 219 including the active layer 214 through the edge of the laser structure. The blue laser structure 200 is independently addressable through contacts 338 and 334 separate from the infrared laser structure 122 and the infrared laser structure 140.

The actual steps in fabricating the independently addressable Red/IR/Blue stack laser structure 300 would include photoresist or silicon nitride masking of the red laser structure 122 and then etching through wet chemical etching or dry etching down to the infrared laser structure 140, masking of the red laser structure 122 and the infrared laser structure 140 then etching the isolation groove, masking of the mesas in the red laser structure 122 and the infrared laser structure 140 then etching to the n-cladding layers, masking of the mesas and the n-cladding layers of the red laser structure 122 and the infrared laser structure 140 then etching down to the blue laser structure 200, masking of the mesas and the n-cladding layers of the red laser structure 122 and the infrared laser structure 140 and a portion of the blue laser structure 200 then etching down to the n-cladding layer of the blue laser structure 200, formation of the p-contacts on the mesas of the red laser structure 122 and the infrared laser structure 140 and formation of the p and n contacts of the blue laser structure 200, masking of the blue laser structure 200 and the p-contacts of the red laser structure 122 and the infrared laser structure 140 then etching to the n-cladding layers of the red laser structure 122 and the infrared laser structure 140, and formation of the n-contacts on the n-cladding layers of the red laser structure 122 and the infrared laser structure 140.

The use of mesa laser structures and metal clad ridge waveguides are merely illustrative examples. The upper confinement layers of p-AlInP can form native oxide ridge waveguides. The specific cladding, confinement and active layers for the red, infrared and blue laser structures can be fabricated from different semiconductor materials other than those listed in this embodiment.

The n-contact layers 120 and 138 of the red and infrared laser structures can be connected through ion implantation, a metal bridge, impurity induced layer disordering or other means. Thus, a n-contact on the n-contact layer 138 will be common to both the red and infrared laser structures.

The fusion bonding layer 142 could, in the alternative, be another indium containing layer such as non-lattice matched InP.

Alternately, the infrared laser structure can be deposited p-side down first on the sacrificial substrate 102 and the substrate removal etch stop layer 104, followed by the deposition p-side down of the red laser structure, followed by the fusion bonding layer 142 and the protective cap layer 143. When the infrared/red laser structure is wafer fused to the blue laser structure, the resulting monolithically integrated laser structure would be p-side up infrared, red and blue laser structures.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted.

While the invention has been described in conjunction with specific embodiments, it is evident to those skilled in the art that many alternatives, modifications, and variations will be apparent in light of the foregoing description. Accordingly, the invention is intended to embrace all such alternatives, modifications, and variations that fall within the spirit and scope of the appended claims.

What is claimed is:

1. A monolithic integrated edge-emitting semiconductor laser structure comprising:
    a first laser structure having
        a first substrate;
        an n-type first cladding layer formed on said substrate;
        a first confinement layer, a first active layer for emitting light of a first wavelength, and a second confinement layer forming a first active region on said first cladding layer;
        a p-type second cladding layer formed on said second confinement layer above said first active region,
    a second laser structure having
        a fusion layer for bonding said first laser structure and said second laser structure, an n-type first contact layer formed on said fusion layer;

an n-type third cladding layer formed on said first contact layer;

a third confinement layer, a second active layer for emitting light of a second wavelength, and a fourth confinement layer forming a second active region on said third cladding layer;

a p-type fourth cladding layer formed on said fourth confinement layer above said second active region, a p-type second contact layer formed on said fourth cladding layer, a third laser structure having an n-type third contact layer formed on said second contact layer or on a semiconductor layer on said second contact layer, an n-type fifth cladding layer formed on said third contact layer;

a fifth confinement layer, a third active layer for emitting light of a third wavelength, and a sixth confinement layer forming a third active region on said fifth cladding layer;

a p-type sixth cladding layer formed on said sixth confinement layer above said third active region, a p-type fourth contact layer formed on said sixth cladding layer, a first contact and a second contact which enable biasing of said first active region for emission of light of said first wavelength, a third contact and a fourth contact which enable biasing of said second active region for emission of light of said second wavelength, and a fifth contact and a sixth contact which enable biasing of said third active region for emission of light of said third wavelength.

2. The monolithic integrated edge-emitting semiconductor laser structure of claim 1 wherein said first wavelength is in the blue range, said second wavelength is in the infrared range and said third wavelength is in the red range.

3. The monolithic integrated edge-emitting semiconductor laser structure of claim 1 wherein said first wavelength is in the blue range, said second wavelength is in the red range and said third wavelength is in the infrared range.

4. The monolithic integrated edge-emitting semiconductor laser structure of claim 2 wherein said first substrate of said first laser structure is $Al_2O_3$, said first and second cladding layers of said first laser structure are GaN, said first and second confinement layers of said first laser structure are $Al_{0.08}Ga_{0.92}N$, said first active layer of said first laser structure is an $In_{0.15}Ga_{0.85}N/In_{0.02}Ga_{0.98}N$ multiple quantum well, said fusion layer is GaInP, said first contact layer of said second laser structure is GaAs, said third and fourth cladding layers of said second laser structure are $Al_{0.5}In_{0.5}P$, said third and fourth confinement layers of said second laser structure are $Al_{0.4}Ga_{0.6}As$, said second active layer of said second laser structure is AlGaInAs, said second contact layer of said second laser structure is GaAs, said third contact layer of said third laser structure is GaAs, said fifth and sixth cladding layers of said third laser structure are $Al_{0.5}In_{0.5}P$, said fifth and sixth confinement layers of said third laser structure are $In_{0.5}(Al_{0.6}Ga_{0.4})_{0.5}P$, said third active layer of said third laser structure is $Ga_{0.4}In_{0.6}P$, and said second fourth layer of said third laser structure is GaAs.

5. The monolithic integrated edge-emitting semiconductor laser structure of claim 2 wherein an etch stop layer is formed between said second contact layer of said second laser structure and said third contact layer of said third laser structure.

6. The monolithic integrated edge-emitting semiconductor laser structure of claim 2 wherein said first contact is on said second cladding layer of said first laser structure, said second contact is on said first cladding layer of said first laser structure, said third contact is on said second contact layer of said second laser structure, said fourth contact is on said third cladding layer of said second laser structure, said fifth contact is on said fourth contact layer of said third laser structure and said sixth contact is on fifth cladding layer of said third laser structure.

* * * * *

UNITED STATES PATENT AND TRADEMARK OFFICE
CERTIFICATE OF CORRECTION

| | |
|---|---|
| PATENT NO. | : 6,144,683 |
| APPLICATION NO. | : 09/004176 |
| DATED | : November 7, 2000 |
| INVENTOR(S) | : Philip D. Floyd |

It is certified that error appears in the above-identified patent and that said Letters Patent is hereby corrected as shown below:

Column 1, line 3, insert as a new paragraph:

This invention was made with Government support under Agreement No. 70NANB2H1241 awarded by the Department of Commerce. The Government has certain rights in this invention.

Signed and Sealed this

Seventeenth Day of July, 2007

JON W. DUDAS
*Director of the United States Patent and Trademark Office*